United States Patent [19]
Larrick et al.

[11] Patent Number: 5,410,282
[45] Date of Patent: Apr. 25, 1995

[54] WIDE DYNAMIC RANGE AMPLIFIER WITH ERROR CORRECTION

[75] Inventors: Ronald J. Larrick, Redmond; Richard I. Lane, Bend, both of Oreg.

[73] Assignee: Tektronix, Inc., Wilsonville, Oreg.

[21] Appl. No.: 209,767

[22] Filed: Mar. 14, 1994

[51] Int. Cl.⁶ ............................................. H03F 1/26
[52] U.S. Cl. ..................... 330/149; 330/59; 330/15.1; 330/308; 359/189
[58] Field of Search ............... 330/59, 149, 151, 308; 250/214 A; 328/162, 163; 359/189

[56] References Cited

U.S. PATENT DOCUMENTS

| | | | |
|---|---|---|---|
| 4,792,998 | 2/1988 | Toussaint | 330/308 X |
| 5,123,732 | 6/1992 | Gross et al. | 356/73.1 |
| 5,311,353 | 5/1994 | Crawford | 359/333 |

*Primary Examiner*—James B. Mullins
*Attorney, Agent, or Firm*—William K. Bucher

[57] ABSTRACT

An error corrected wide dynamic range amplifier has a transimpedance amplifier where the input signal node is used as a monitoring point for providing an error correction voltage to a combining circuit that also receives the voltage on the output node of the transimpedance amplifier. The combining circuit subtracts the input signal node voltage from the output signal voltage to produce a resultant voltage substantially free of errors produced by non-ideal characteristics of the transimpedance amplifier. The combining circuit may be implemented using analog or digital circuitry. The digital combining circuit may also add digital correction values representative of circuit component errors of the wide dynamic range amplifier. Such a wide dynamic range amplifier is usable in high sensitivity, wide dynamic range optical receivers, such as found in optical time domain reflectometers or other optical measurement instruments.

40 Claims, 5 Drawing Sheets

WIDE DYNAMIC RANGE AMPLIFIER WITH ERROR CORRECTION

BACKGROUND OF THE INVENTION

The present invention relates generally to wide dynamic range amplifiers and more particularly to a transimpedance amplifier having error correction circuitry for reducing non-ideal amplifier characteristics in the output signal of the amplifier.

Transimpedance amplifiers are used in many electronic applications for converting an input current signal to a corresponding proportional voltage signal. The voltage across the feedback element of the transimpedance amplifier depends on the impedance of the feedback element and the current through the element according to Ohm's law. If the voltage at one end of the feedback element remains at 0 volts, then the voltage at the other end is proportional to the current through the element. The assumption made for most transimpedance amplifier designs is that the input summing junction remains at 0 volts. For more accurate designs, gains are adjusted by a fixed amount to correct for the finite gain of the amplifier. Other errors are less predictable and cannot normally be corrected for, such as: amplifier gain changes with time, temperature, and signal level; offsets created by temperature changes in transistors as the signal level changes; offset created by charge stored in circuit capacitance when overloads occur; and slew rate errors which depend on the signal levels and circuit clamp techniques. Each of these errors can be significant in measurement instruments, such as an optical time domain reflectometer, OTDR, due to the requirements of wide bandwidth, high dynamic range, sensitivity to low-level signals, and accurate measurement of light level versus time.

In an OTDR, light pulses are launched into a fiber under test. During the intervals between the light pulses, return reflected light, in the form of Rayleigh backscatter and high amplitude reflections, is converted to a current signal, amplified, digitized, and stored for further processing. The return reflected light signal has an optical dynamic range as large as 100 dB which corresponds to an electrical dynamic range of 200 dB. In addition, the Rayleigh backscatter signal decreases exponentially with distance generating increasingly weak return backscatter signals from the distant portions of the fiber. A photosensitive device, such as an avalanche photodiode or the like, converts the return reflected light into a current signal. The corresponding current signal is coupled to a transimpedance amplifier, which converts the current signal into a corresponding proportional voltage signal. The voltage output of the transimpedance amplifier, which ranges down to the nanovolt region, is further amplified and coupled to an analog-to-digital converter, which converts the voltage signal into corresponding digital values. The digital values are stored in a memory device, such as RAM, in the OTDR and are subsequently retrieved for further processing and display.

For an ideal transimpedance amplifier, the voltage at the input of the amplifier is always zero. With this assumption, $V_{out}$ equals the magnitude of the input current multiplied by the impedance of the feedback element. If the impedance and characteristics of the feedback element are known, then the photodetector current is represented by the voltage at $V_{out}$. The feedback element may be linear as in the case of a resistor or nonlinear as in the case of a diode or the like. This is the technique used in most OTDRs. The quality of $V_{out}$ representing the photodetector current suffers due to the non-ideal characteristics of the amplifier and associated amplifier components. The first non-ideal characteristic of the amplifier, which affects the quality of $V_{out}$ is amplifier gain. The gain of the amplifier is lower than ideal, and the gain varies with the signal level applied. With low gain, the voltage at the input of the amplifier will change with signal level. As the gain varies with signal level, $V_{out}$ will be nonlinear. The second non-ideal characteristic of the amplifier which affects the quality of $V_{out}$ is offset voltages created due to thermal effects. As the signal of the amplifier changes, the components which provide the gain will change temperature, creating offsets which depend on the temperature at any given instant. These offsets combine with the signal and reduce the quality of $V_{out}$, creating errors often called nonlinearities, undershoot, and thermal tail. Since the voltage on the input node does not remain at zero volts, currents may be produced in the associated amplifier components, such as input clamping diodes, circuit capacitances, and the like. These currents subtract from the input current being coupled to the feedback element producing additional output errors.

U.S. Pat. No. 5,123,732 describes a current-voltage converter for use in an OTDR having an transimpedance amplifier with an input port, an output terminal and a resistor coupled between the input port and the output terminal. A voltage clipping means, in the form of a clipping diode, is coupled between the input port and a fixed potential to prevent saturation of the transimpedance amplifier due to high current input signals caused by high amplitude return signals from a fiber under test. The potential on the clipping diode is such that capacitive effects of the diode are reduced. However, other errors, such as offsets created by temperature changes as the input signal level changes, changes in the gain of the amplifier with the signal level applied, and the like are not reduced or eliminated with this circuit.

What is needed is a wide dynamic range amplifier that accurately produces an output signal representative of an input signal without errors associated with the non-ideal characteristics of such amplifiers. Further, the wide dynamic range amplifier should be capable of correcting other errors caused by circuit components, such as clamping diodes, circuit capacitances, and the like.

SUMMARY THE INVENTION

Accordingly, the present invention is a wide dynamic range amplifier having a transimpedance amplifier and a correction circuit that produces an output substantially free of errors associated with the non-ideal characteristics of the wide dynamic range amplifier. The transimpedance amplifier has an impedance feedback element coupled between a voltage input node and a voltage output node of the transimpedance amplifier for converting a current input signal into a voltage output signal as a function of the input current signal being multiplied by the impedance of the feedback element. The correction circuit is coupled to receive the voltages on the input and output nodes of the transimpedance amplifier containing the errors of the amplifier. The correction circuit monitors the voltage on the input signal node for producing a wide dynamic range amplifier output substantially free of the errors associated with non-ideal characteristics of the wide dynamic range amplifier. The correction circuit may be an analog summing amplifier producing the wide dynamic range amplifier output as a function of subtracting the voltage on the input signal node from the voltage on the output signal node.

In a further aspect of the present invention, a buffer amplifier is coupled between a current input source and the voltage input node of the transimpedance amplifier for minimizing capacitive effects of the input current source. In particular, the buffer amplifier is a source follower having a high input impedance and a low output impedance.

In still a further aspect of the invention, the correction circuit has a analog-to-digital converter selectively coupled to the input and output signal nodes of the transimpedance amplifier for converting the voltages thereon into digital values representative of the respective voltages. Means are provided for combining the digital values representative of the voltages on the input and output nodes to produce digital values representative of the output of the wide dynamic range amplifier substantially free of errors. The combining means provides digital values representative of the wide dynamic range amplifier as a function of subtracting the digital values representative of the voltage on the input signal node from the digital values representative of the voltage on the output signal node. The correction circuit has means for selectively coupling the respective voltages from the input and output signal nodes of the transimpedance amplifier to the analog-to-digital converter. The coupling means is further a switch having inputs coupled to the input and output nodes and an output coupled to the analog-to-digital converter with the switch being a multiplexer. The correction circuit may further include first and second analog-to-digital converters with one converter coupled to the voltage input node of the transimpedance amplifier and the other coupled to the voltage output node of the amplifier. Each converter converts the respective voltages on the input and output nodes into digital values representative of the voltages on the respective nodes and couples these values to the combining means. The objects, advantages and novel features of the present invention are apparent from the following detailed description when read in conjunction with appended claims and attached drawings.

DETAILED DESCRIPTION OF THE PREFERRED EMBODIMENT

Figure 1:
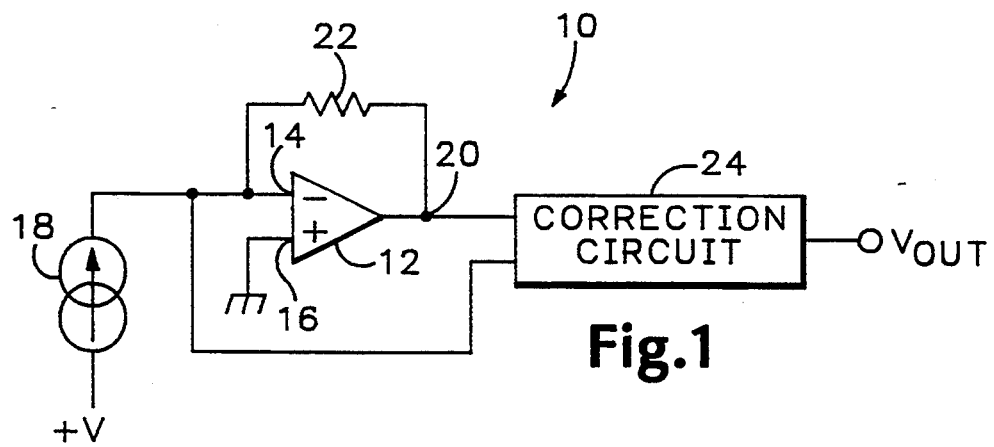
FIG. 1 is a simplified schematic diagram of the wide dynamic range amplifier according to the present invention.

Referring to FIG. 1 there is shown a simplified schematic of the wide dynamic range amplifier 10 according to the present invention. Amplifier 10 includes a transimpedance amplifier 12 having inverting and non-inverting input nodes 14 and 16 with the inverting node 14 coupled to a signal source 18, such as an avalanche photodiode, current generator, or the like. The non-inverting node 16 is coupled to ground or other reference source. Amplifier 12 also includes an output node 20 with an impedance feedback element 22, such as a resistor, diode or the like, coupled between the input signal node 14 and the output node 20. Both linear and nonlinear feedback elements may be used in the practice of the invention. Nonlinear feedback elements would be used to expand the dynamic range or reduce the effects of overloads. The main consideration for the feedback element 22 is knowing the characteristics of the element. Both the input and output signal nodes 14 and 20 are coupled to a correction circuit 24.

Ideally, a current generated by the signal source 18 is coupled through the feedback element 22 creating a voltage at the amplifier node 14. The amplifier 12 responds by changing the voltage on the output node 20 to a voltage of opposite polarity and sufficient value to keep the voltage on the input node close to the value which existed before the signal from the signal source 18 created the voltage on node 14.

As has been previously described, for an ideal transimpedance amplifier, the voltage at the input node of the amplifier is always zero. If this were the case, then all of the current from the signal source 18 would be coupled through the feedback element 22 and the output voltage signal would accurately represent the input current signal. In actuality, the voltage on the node 14 does not remain at zero volts due to the non-ideal characteristics of the amplifier 12. These produce errors in the output voltage. Previous attempts at correcting these errors have dealt with monitoring the voltage on the output node 20. In applicants' invention a second monitoring point is added. This monitoring point is the summing node 14 of the amplifier 12. The voltages on the input node 14 and the output node 20 are coupled to the correction circuit 24, which combines the voltages subtractively to produce a voltage output $V_{out}$ substantially free of errors.

Figure 2:
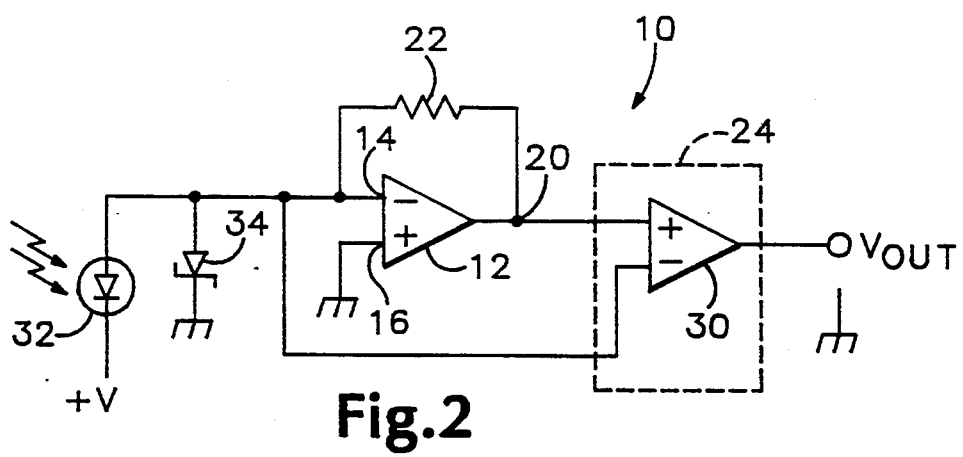
FIG. 2 is a schematic representation of an analog implementation of the correction circuit incorporating a differential amplifier in the wide dynamic range amplifier according to the present invention.

Referring to FIG. 2 there is shown wide dynamic range amplifier 10 incorporating a differential amplifier 30 as an analog implementation of the correction circuit 24. Like elements in FIGS. 1 and 2 are numbered the same. The wide dynamic range amplifier 10 receives a current input from a photosensitive device 32, such as an avalanche photodiode, PIN photodiode, or the like, with one end of the photodiode 32 coupled to the input node 14 of the transimpedance amplifier 12 and the other end coupled to a potential voltage source. Wide dynamic range amplifier 10 and photodiode 32 may be a part of an optical receiver of an optical measurement instrument, such as an optical time domain reflectometer (OTDR) or the like. Return reflected light from a fiber under test, connected to the OTDR, hits the photodiode 32 producing a current output representative of the return reflected light. The current signal from the photodiode 32 is coupled to the summing node 14 of the transimpedance amplifier 12. Also connected to the input summing node 14 is a clamping diode 34 for limiting the amount of current received at node 14 during periods of high optical signal input. As the input current signal changes, the voltage on node 14 varies due to the lower than ideal gain of amplifier 12 and the thermal affects on the components that provide gain. These gain changes and thermal affects, which show up on both the input node 14 and the output node 20, create errors in the output voltage signal. The voltages on both the input and output signal nodes 14 and 20 are respectively coupled to the minus and plus inputs of differential amplifier 30 acting as the correction circuit 24. Differential amplifier 30 is of a common design where the output of the amplifier 30 is between ground and the output. Differential amplifier 30, operating in a manner commonly referred to as a summing amplifier, takes the amplifier 12 output on node 20 and subtracts monitored voltage signal on the input summing node 14 of amplifier 12. The output of the differential amplifier 30 essentially reflects the voltage across the feedback element 22 and ignores any voltage errors created by the amplifier 12. The output of the differential amplifier 30 is substantially free of nonlinearities and thermal tail errors caused by amplifier gain changes and thermal offset errors.

Figure 3:
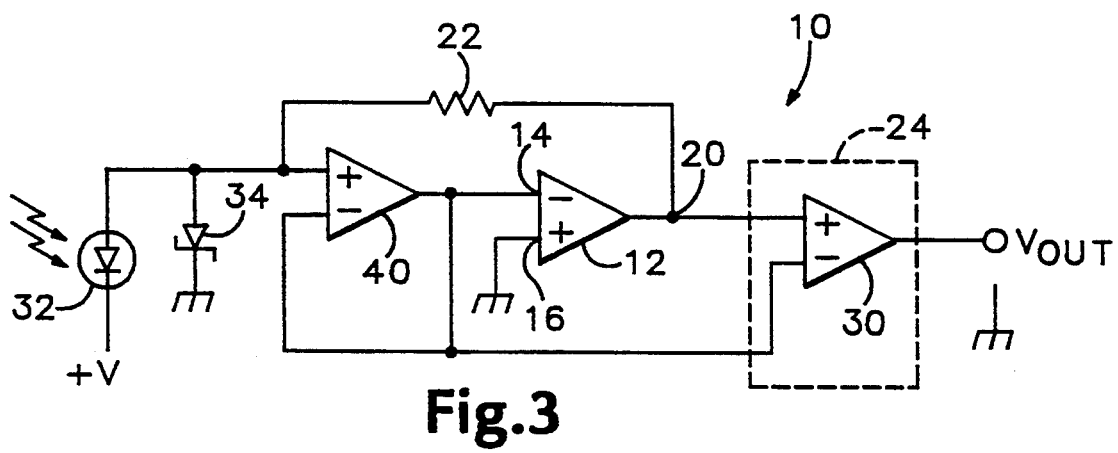
FIG. 3 is a schematic representation of the wide dynamic range amplifier with an input buffer amplifier according to the present invention.

Referring to FIG. 3 there is shown a further aspect of applicants' claimed invention having a buffer amplifier 40 coupled between the photosensitive device 32, acting as a signal source, and the input signal node 14 of amplifier 12. Like elements in FIGS. 1, 2 and 3 are numbered the same. The buffer amplifier 40 is a simple source follower producing a high impedance input and a low impedance output and operating at biased current level where it is least sensitive to temperature changes. The buffer amplifier 40 is used in this implementation to improve speed by minimizing the capacitance at the photodetector 32.

Figure 4:
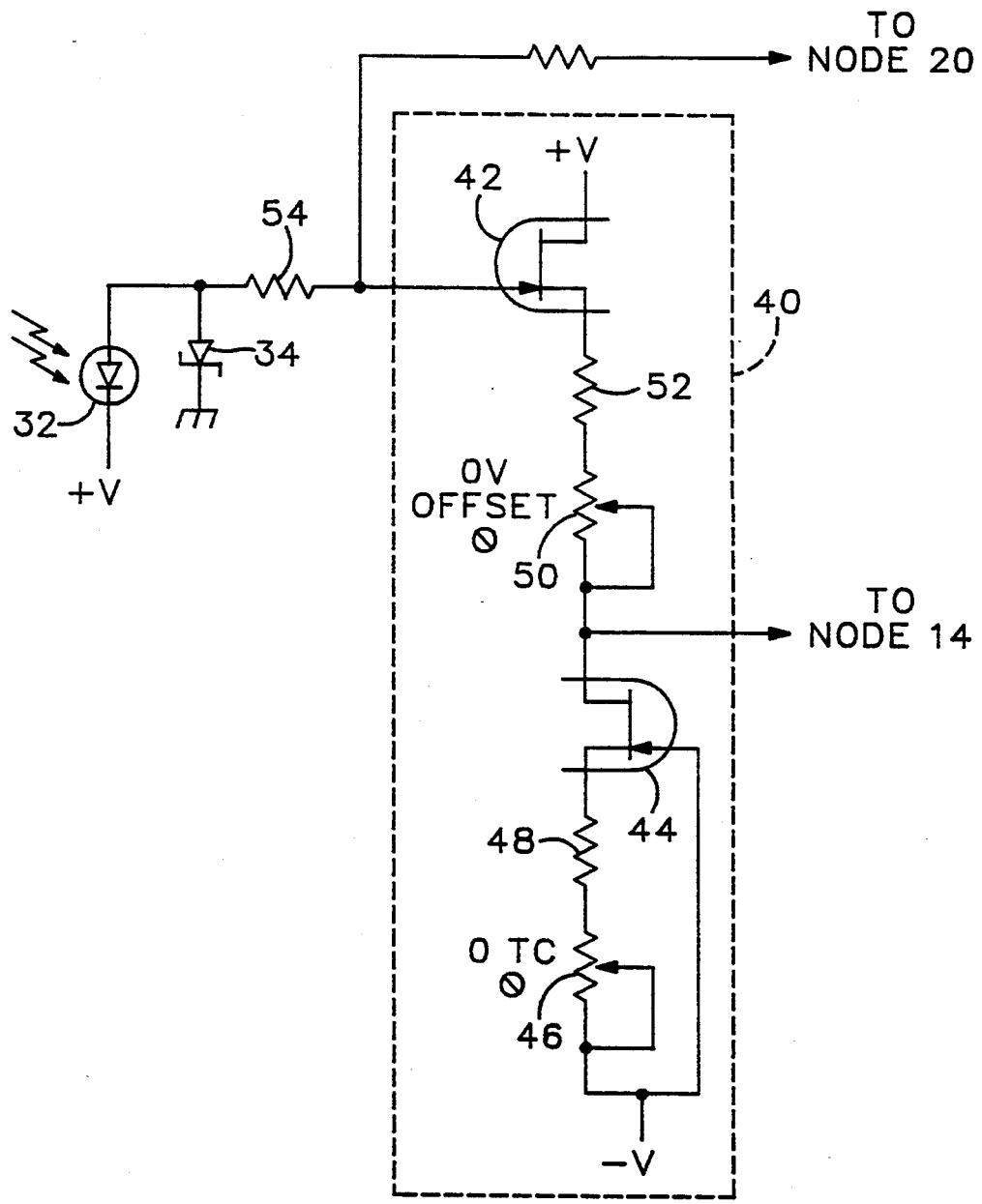
FIG. 4 is a schematic representation of a representative buffer amplifier used in the wide dynamic range amplifier according to the present invention.

FIG. 4 schematically shows a representative buffer amplifier 40 for use in applicants' claimed invention. The buffer amplifier 40 is a dual FET device having one FET 42 acting as a source follower and the other FET 44 acting as a current source. The source of FET 44 is coupled to a voltage source −V through an adjustable temperature coefficient "TC" resistor 46 and resistor 48. The gate of FET 44 is coupled to the −V voltage source. The constant current output of FET 44 is coupled through adjustable offset resistor 50 and resistor 52 to the source of source follower FET 42. The drain of FET 42 is coupled to voltage source +V. The gate of FET 42 is coupled to the photodiode 32 via resistor 54 for receiving a current input signal. The gate of FET 42 is also coupled to the impedance feedback element 22. The output of buffer amplifier 40 is taken from the junction of FET 44 and adjustable offset resistor 50 and coupled to the input node 14 of amplifier 12.

The temperature coefficient TC resistor 46 is adjusted to where the current produced using FET 44 operates FET 42 at a point where FET 42 is least sensitive to temperature changes. The power dissipated by FET 42 is a function of the current through the device and the voltage across it. The current from FET 44 to FET 42 is constant but the voltage across FET 42 changes as a function of the input signal. As the voltage changes across FET 42 and the current remains constant, FET 42 heats up and cools off in millidegrees. Since the dynamic range of the amplifier 10 goes into the nanovolt range, these slight changes in the temperature of FET 42 are enough to affect the dynamic range of the amplifier 10. Therefore, TC resistor is adjusted so that the temperature coefficient of FET 42 is minimum. The adjustable offset resistor 50 is adjusted to set the input and output of the buffer amplifier 40 at the same level with no signal present.

Figure 5:
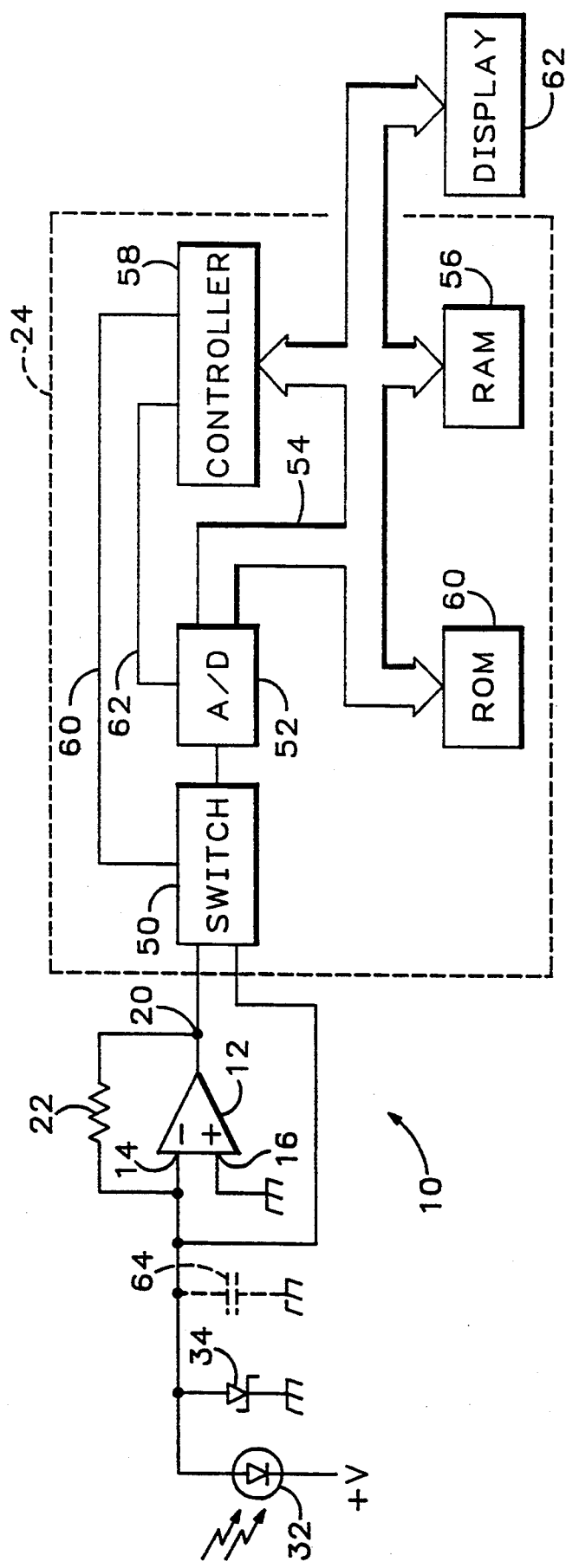
FIGS. 5 and 6 are representative block diagrams of digital implementations of the correction circuit in the wide dynamic range amplifier according to the present invention.
Figure 6:
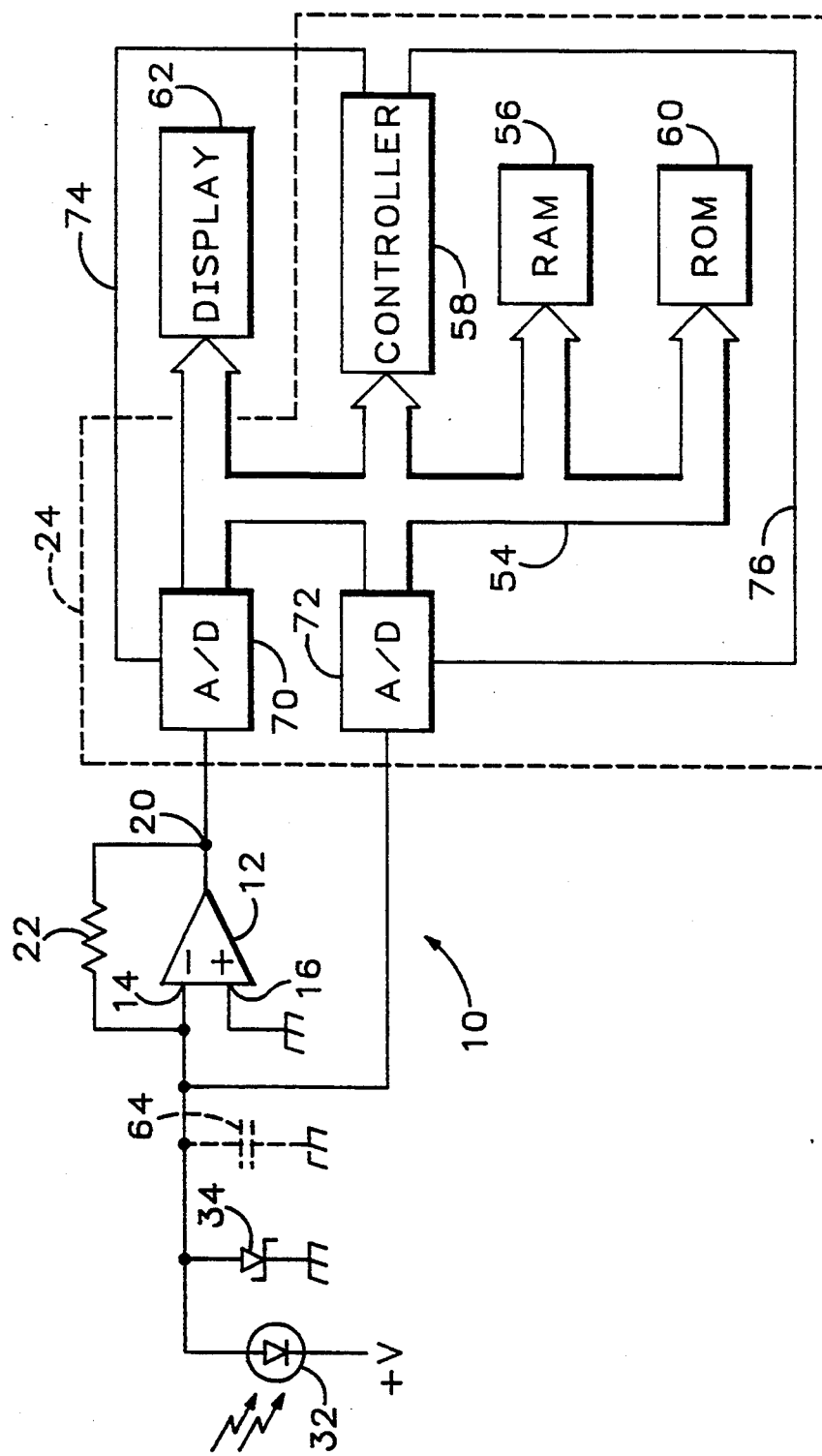

Referring to FIGS. 5 and 6, there are shown digital implementations of the correction circuit 24 of the wide dynamic range amplifier 10o The digital implementation of FIG. 5 is the same as FIG. 6 with the exception that the input and output signal nodes 14 and 20 in FIG. 5 are coupled to a single analog-to-digital (A/D) converter 52 through switch 50 while input and output signal nodes 14 and 20 in FIG. 6 are coupled to separate analog-to-digital (A/D) converters 70 and 72. As with previous figures, like elements are numbered the same. The digital output representative of the voltages on nodes 14 and 20 from A/D 52 in FIG. 5 and the digital outputs from A/Ds 70 and 72 in FIG. 6 are coupled via address and data bus 54 to RAM 56 for storage. Operational control of the switch 50 and A/Ds 52, 70 and 72 is provided by controller 58 via respective control lines 60 and 62 in FIG. 5 and lines 74 and 76 in FIG. 6. Processing of the stored digital values is performed by the controller in response to stored programs in ROM 60. The processed digital values are passed to the display 62, which may include a display processor, display memory, and a display device, such as a cathode ray tube, flat panel display or the like.

The voltages on the input signal node 14 and the output signal node 20 of transimpedance amplifier 12 are coupled either through multiplexer (MUX) switch 50 to A/D 52 or directly to A/Ds 70 and 72. The A/Ds 52, 70, 72 convert the voltages on their inputs to digital values representative of the voltages. The digital values are stored in RAM 56. The respective digital values of the voltages on nodes 14 and 20 are retrieved by the controller, such as a microprocessor, operating under programmed control from previously stored programs in ROM 60 and combined subtractively to produce digital values representative of the output of the wide dynamic range amplifier substantially free of errors produced by the transimpedance amplifier 12. Programs for performing such a subtraction function are well known in the art and need not be set forth in greater detail. The important concept is that the input signal node 14 is monitored and the voltage thereon is subtracted from the voltage on the output signal node 20 to produce an output substantially free of errors.

An additional benefit is achieved using a digital implementation of the correction circuit 24 in the present invention. The wide dynamic range amplifier 10 has additional circuit components, such as a clamping shottkey diode and circuit capacitances, shown as capacitor 64. The circuit capacitance may be caused by trace runs in the circuit board on which the wide dynamic range amplifier 10 resides, transistor junction capacitances, and the like. Producing a non zero voltage on the input signal node 14 of amplifier 12 will produce currents through diode 34 and capacitor 64. However, the current through diode 34 tends to be predictable following the form $I_o e^{-qv/kt}$. If the voltage on the diode 34 is known at any instant in time, then the current through the diode can be calculated. Similarly, the current through the capacitor 64 is equal to Cdv/dt where C is the capacitance, V is the voltage and T is the time. By monitoring the change in voltage on node 14 and knowing what the capacitance is, the current through the capacitor can be calculated. Using the known characteristics of the diode 34 and the capacitor 64 and the voltage on node 14, the controller 58, using an appropriate algorithm incorporating the known characteristics and voltage, can calculate the current through the non-ideal components. Using these current values and the value of the feedback element, digital correction values may be generated and added to the digital values resulting from the subtraction of the digital values representing the voltages of the input signal node 14 and the output signal node 20.

Figure 7:
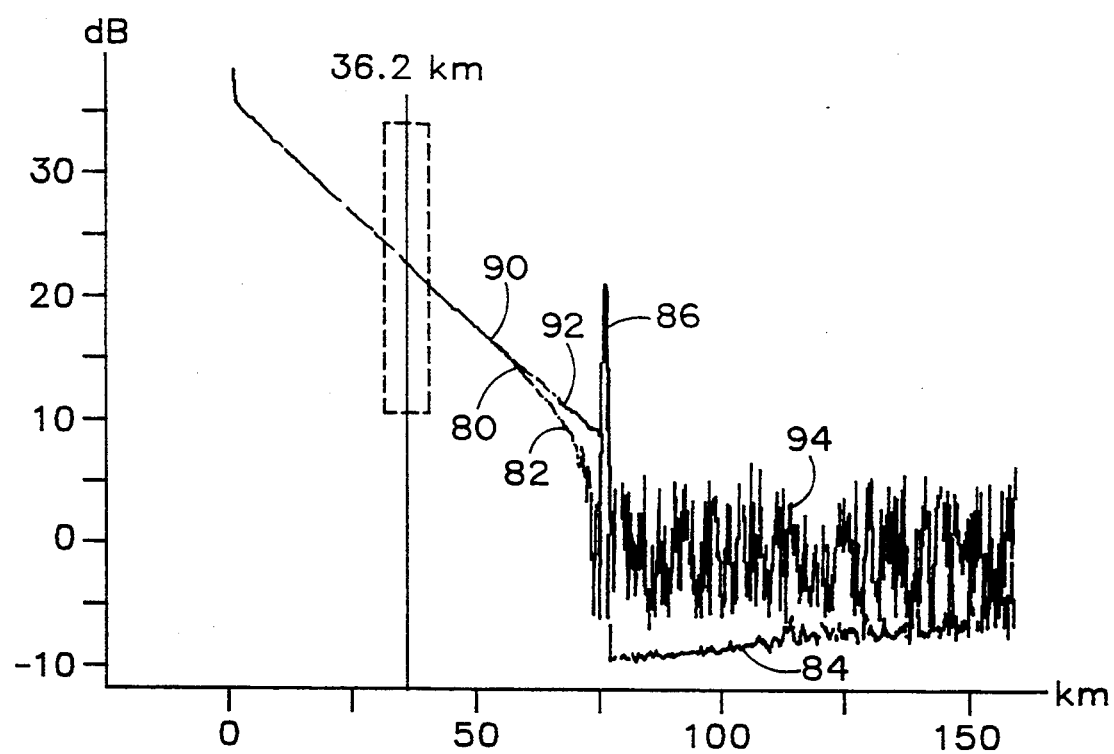
FIG. 7 is a representations of two composite OTDR traces with and without the wide dynamic range amplifier according to the present invention.

Referring to FIG. 7, there is shown a composite of two OTDR traces with and without the wide dynamic range amplifier 10 of the present invention. The wide dynamic range amplifier 10 is part of an optical receiver in the OTDR that converts return reflected light from a fiber under test to an electrical signal that is stored, processed, and displayed on a display device. Trace 80 is produced with a wide dynamic range amplifier not incorporating applicants present invention. The trace 80 becomes nonlinear in the region noted as 82 due to the errors associated with the amplifier. In addition, the noise floor 84 after the end of the fiber 86 is inconsistent. Trace 90 is produced using the wide dynamic range amplifier 10 in the optical receiver of the OTDR. Region 92 corresponding to region 82 in the previous trace is substantially more linear and the noise floor 94 is much more constant after the end of the fiber 86 is reached. Trace 90 more accurately represents the current flowing from the photodiode 34 in the optical receiver.

A wide dynamic range amplifier has been described having a transimpedance amplifier where the input signal node of the transimpedance amplifier is monitored to correct for errors in the amplifier. The input node voltage is subtracted from the output node voltage of the transimpedance amplifier in a combining circuit. The combining circuit may be implemented as an analog circuit using a differential amplifier or digitally using A/D converters and appropriate program controls for subtracting the digital values representing the voltages on the input and output nodes of the transimpedance amplifier. Additionally, digital values representative of circuit component errors in the wide dynamic range amplifier may be generated and combined with the resultant subtracted digital values from the input and output signal nodes of the amplifier. These and other aspects of the present invention are set forth in the appended claims.

What is claimed is:

1. A wide dynamic range amplifier comprising:
    a transimpedance amplifier having an impedance feedback element coupled between a voltage input signal node and a voltage output signal node of the transimpedance amplifier for converting a current input signal into a voltage output signal as a function of the input current signal being multiplied by the impedance of the feedback element; and
    a correction circuit coupled to receive the voltages on the input and output signal nodes of the transimpedance amplifier for monitoring the voltage on the input signal node and producing an output substantially free of errors associated with non-ideal characteristics of the wide dynamic range amplifier.

2. The wide dynamic range amplifier as recited in claim 1 further comprising a buffer amplifier coupled between a current input source and the voltage input node of the transimpedance amplifier for minimizing capacitive effects of the input current source.

3. The wide dynamic range amplifier as recited in claim 2 wherein the buffer amplifier comprises a source follower having a high input impedance and a low output impedance.

4. The wide dynamic range amplifier as recited in claim 1 wherein the correction circuit comprises a summing amplifier producing the wide dynamic range amplifier output as a function of subtracting the voltage on the input signal node from the voltage on the output signal node.

5. The wide dynamic range amplifier as recited in claim 4 wherein the summing amplifier comprises a differential amplifier.

6. The wide dynamic range amplifier as recited in claim 1 wherein the correction circuit comprises:
    an analog-to-digital converter selectively coupled to the input and output signal nodes of the transimpedance amplifier for converting the voltages thereon into digital values representative of the respective voltages; and
    means for combining the digital values representative of the voltage on the input and output signal nodes to produce digital values representative of the output of the wide dynamic range amplifier substantially free of errors.

7. The wide dynamic range amplifier as recited in claim 6 wherein the combining means provides the digital values representative of the output of the wide dynamic range amplifier as a function of subtracting the digital values representative of the voltage on the input signal node from the digital values representative of the voltage on the output signal node.

8. The wide dynamic range amplifier as recited in claim 7 wherein the correction circuit further comprises a means for generating digital values representative of circuit component errors in the wide dynamic range amplifier for combining with the resultant digital values from the subtracting the digital values representative of the voltage on the input signal node from the digital values representative of the voltage on the output signal node.

9. The wide dynamic range amplifier as recited in claim 8 wherein the correction circuit further comprises a means for selectively coupling the respective voltages from the input and output signal nodes of the transimpedance amplifier to the analog-to-digital converter.

10. The wide dynamic range amplifier as recited in claim 9 wherein the coupling means comprises a switch having first and second inputs respectively coupled to the input and output signal nodes of the transimpedance amplifier and an output coupled to the analog-to-digital converter.

11. The wide dynamic range amplifier as recited in claim 10 wherein the switch comprises a multiplexer.

12. The wide dynamic range amplifier as recited in claim 1 wherein the correction circuit comprises:
    a first analog-to-digital converter coupled to the input signal node of the transimpedance amplifier for converting the voltage thereon into digital values representative of the voltage;
    a second analog-to-digital converter coupled to the output signal node of the transimpedance amplifier for converting the voltage thereon into digital values representative of the voltage; and means for combining the digital values representative of the voltage on the input and output signal nodes to produce digital values representative of the output of the wide dynamic range amplifier substantially free of errors, 13. The wide dynamic range amplifier as recited in claim 12 wherein the combining means provides the digital values representative of the output of the wide dynamic range amplifier as a function of subtracting the digital values representative of the voltage on the input signal node from the digital values representative of the voltage on the output signal node, 14. The wide dynamic range amplifier as recited in claim 13 wherein the correction circuit further comprises a means for generating digital values representative of circuit component errors in the wide dynamic range amplifier for combining with the resultant digital values from the subtracting the digital values representative of the voltage on the input signal node from the digital values representative of the voltage on the output signal node.

15. A wide dynamic range amplifier comprising:
a transimpedance amplifier coupled to a current input source for receiving a current input signal and having an impedance feedback element coupled between a voltage input signal node and a voltage output signal node of the transimpedance amplifier for converting the current input signal into a voltage output signal as a function of the input current signal being multiplied by the impedance of the feedback element;
a buffer amplifier coupled between the current input source and the voltage input node for minimizing capacitive effects of the input current source; and
a correction circuit coupled to receive the voltages on the input and output signal nodes of the transimpedance amplifier for monitoring the voltage on the input signal node and producing an output substantially free of errors associated with non-ideal characteristics of the wide dynamic range amplifier.

16. The wide dynamic range amplifier as recited in claim 15 wherein the buffer amplifier comprises a source follower having a high input impedance and a low output impedance.

17. The wide dynamic range amplifier as recited in claim 15 wherein the correction circuit comprises a summing amplifier producing the wide dynamic range amplifier output as a function of subtracting the voltage on the input signal node from the voltage on the output signal node.

18. The wide dynamic range amplifier as recited in claim 17 wherein the summing amplifier comprises a differential amplifier.

19. The wide dynamic range amplifier as recited in claim 15 wherein the correction circuit comprises:
an analog-to-digital converter selectively coupled to the input and output signal nodes of the transimpedance amplifier for converting the voltages thereon into digital values representative of the respective voltages; and
means for combining the digital values representative of the voltage on the input and output signal nodes to produce digital values representative of the output of the wide dynamic range amplifier substantially free of errors.

20. The wide dynamic range amplifier as recited in claim 19 wherein the combining means provides the digital values representative of the output of the wide dynamic range amplifier as a function of subtracting the digital values representative of the voltage on the input signal node from the digital values representative of the voltage on the output signal node.

21. The wide dynamic range amplifier as recited in claim 20 wherein the correction circuit further comprises a means for generating digital values representative of circuit component errors in the wide dynamic range amplifier for combining with the resultant digital values from the subtracting the digital values representative of the voltage on the input signal node from the digital values representative of the voltage on the output signal node.

22. The wide dynamic range amplifier as recited in claim 21 wherein the correction circuit further comprises a means for selectively coupling the respective voltages from the input and output signal nodes of the transimpedance amplifier to the analog-to-digital converter.

23. The wide dynamic range amplifier as recited in claim 22 wherein the coupling means comprises a switch having first and second inputs respectively coupled to the input and output signal nodes of the transimpedance amplifier and an output coupled to the analog-to-digital converter.

24. The wide dynamic range amplifier as recited in claim 23 wherein the switch comprises a multiplexer.

25. The wide dynamic range amplifier as recited in claim 15 wherein the correction circuit comprises:
a first analog-to-digital converter coupled to the input signal node of the transimpedance amplifier for converting the voltage thereon into digital values representative of the voltage;
a second analog-to-digital converter coupled to the output signal node of the transimpedance amplifier for converting the voltage thereon into digital values representative of the voltage; and
means for combining the digital values representative of the voltage on the input and output signal nodes to produce digital values representative of the output of the wide dynamic range amplifier substantially free of errors.

26. The wide dynamic range amplifier as recited in claim 25 wherein the combining means provides the digital values representative of the output of the wide dynamic range amplifier as a function of subtracting the digital values representative of the voltage on the input signal node from the digital values representative of the voltage on the output signal node.

27. The wide dynamic range amplifier as recited in claim 26 wherein the correction circuit further comprises a means for generating digital values representative of circuit component errors in the wide dynamic range amplifier for combining with the resultant digital values from the subtracting the digital values representative of the voltage on the input signal node from the digital values representative of the voltage on the output signal node.

28. A wide dynamic range amplifier comprising:
a transimpedance amplifier having an impedance feedback element coupled between a voltage input signal node and a voltage output signal node of the transimpedance amplifier for converting a current input signal into a voltage output signal as a function of the input current signal being multiplied by the impedance of the feedback element; and a correction circuit having an analog-to-digital converter selectively coupled to the input and output signal nodes of the transimpedance amplifier for converting the voltages thereon into digital values representative of the respective voltages and means for combining the digital values representative of the voltages on the input and output signal nodes to produce digital values representative of the output of the wide dynamic range amplifier substantially free of errors.

29. The wide dynamic range amplifier as recited in claim 28 wherein the combining means provides the digital values representative of the output of the wide dynamic range amplifier as a function of subtracting the digital values representative of the voltage on the input signal node from the digital values representative of the voltage on the output signal node.

30. The wide dynamic range amplifier as recited in claim 29 wherein the correction circuit further comprises a means for generating digital values representative of circuit component errors in the wide dynamic range amplifier for combining with the resultant digital values from the subtracting the digital values representative of the voltage on the input signal node from the digital values representative of the voltage on the output signal node.

31. The wide dynamic range amplifier as recited in claim 30 wherein the correction circuit further comprises a means for selectively coupling the respective voltages from the input and output signal nodes of the transimpedance amplifier to the analog-to-digital converter.

32. The wide dynamic range amplifier as recited in claim 31 wherein the coupling means comprises a switch having first and second inputs respectively coupled to the input and output signal nodes of the transimpedance amplifier and an output coupled to the analog-to-digital converter.

33. The wide dynamic range amplifier as recited in claim 32 wherein the switch comprises a multiplexer.

34. The wide dynamic range amplifier as recited in claim 28 further comprising a buffer amplifier coupled between a current input source and the voltage input node of the transimpedance amplifier for minimizing capacitive effects of the input current source.

35. The wide dynamic range amplifier as recited in claim 1 wherein the buffer amplifier comprises a source follower having a high input impedance and a low output impedance.

36. The wide dynamic range amplifier comprising:
a transimpedance amplifier having an impedance feedback element coupled between a voltage input signal node and a voltage output signal node of the transimpedance amplifier for converting a current input signal into a voltage output signal as a function of the input current signal being multiplied by the impedance of the feedback element;
a correction circuit having a first analog-to-digital converter coupled to the input signal node of the transimpedance amplifier for converting the voltage thereon into digital values representative of the voltage;
a second analog-to-digital converter coupled to the output signal node of the transimpedance amplifier for converting the voltage thereon into digital values representative of the voltage; and
means for combining the digital values representative of the voltages on the input and output signal nodes to produce digital values representative of the output of the wide dynamic range amplifier substantially free of errors.

37. The wide dynamic range amplifier as recited in claim 36 wherein the combining means provides the digital values representative of the output of the wide dynamic range amplifier as a function of subtracting the digital values representative of the voltage on the input signal node from the digital values representative of the voltage on the output signal node.

38. The wide dynamic range amplifier as recited in claim 37 wherein the correction circuit further comprises a means for generating digital values representative of circuit component errors in the wide dynamic range amplifier for combining with the resultant digital value from the subtracting the digital values representative of the voltage on the input signal node from the digital values representative of the voltage on the output signal.

39. The wide dynamic range amplifier as recited in claim 36 further comprising a buffer amplifier coupled between a current input source and the voltage input node of the transimpedance amplifier for minimizing capacitive effects of the input current source.

40. The wide dynamic range amplifier as recited in claim 39 wherein the buffer amplifier comprises a source follower having a high input impedance and a low output impedance.

* * * * *